(12) United States Patent
Zhu et al.

(10) Patent No.: US 9,966,734 B2
(45) Date of Patent: May 8, 2018

(54) HIGH SPEED SEMICONDUCTOR LASER WITH A BEAM EXPANDING STRUCTURE

(71) Applicant: Institute of Semiconductors, Chinese Academy of Sciences, Beijing (CN)

(72) Inventors: Ninghua Zhu, Beijing (CN); Jianguo Liu, Beijing (CN); Jinjin Guo, Beijing (CN); Wei Chen, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 0 days. days.

(21) Appl. No.: 15/497,107

(22) Filed: Apr. 25, 2017

(65) Prior Publication Data

US 2017/0310080 A1 Oct. 26, 2017

(30) Foreign Application Priority Data

Apr. 26, 2016 (CN) .......................... 2016 1 0265119

(51) Int. Cl.
| | |
|---|---|
| *H01S 5/10* | (2006.01) |
| *H01S 5/026* | (2006.01) |
| *H01S 5/028* | (2006.01) |
| *H01S 5/22* | (2006.01) |
| *H01S 5/12* | (2006.01) |
| *H01S 5/022* | (2006.01) |

(52) U.S. Cl.
CPC ............ *H01S 5/1014* (2013.01); *H01S 5/026* (2013.01); *H01S 5/028* (2013.01); *H01S 5/1003* (2013.01); *H01S 5/12* (2013.01); *H01S 5/22* (2013.01); *H01S 5/022* (2013.01); *H01S 5/10* (2013.01)

(58) Field of Classification Search
CPC ........ H01S 5/10; H01S 5/1003; H01S 5/1014; H01S 5/12; H01S 5/22; H01S 5/028; H01S 5/026
See application file for complete search history.

(56) References Cited

U.S. PATENT DOCUMENTS 8,855,156 B2 * 10/2014 Koeth .................. H01S 5/1228
372/45.01

* cited by examiner

*Primary Examiner* — Armando Rodriguez
(74) *Attorney, Agent, or Firm* — Fish & Richardson P.C.

(57) ABSTRACT

The present invention discloses a semiconductor laser comprising an optical waveguide structure which may include a lower waveguide layer, an active layer of multiple quantum wells and an upper waveguide layer, which are successively stacked from bottom to top, a grating layer being formed on upper portion of the active layer, wherein the upper waveguide layer, a cladding layer and a contact layer are formed as a ridge which has a light incidence end surface and a light output end surface, wherein a beam expanding structure is formed on one end of the output end surface. The beam expanding structure has a beam expanding portion with a shape gradually contracted inwards from the light output end surface. Preferably, the beam expanding portion has a horizontal divergence angle of 5° to 20°.

18 Claims, 2 Drawing Sheets

US 9,966,734 B2

HIGH SPEED SEMICONDUCTOR LASER WITH A BEAM EXPANDING STRUCTURE

TECHNICAL FIELD

The present disclosure relates to a field of semiconductor technology, and more particularly, to a high speed semiconductor laser with a light output end surface having a light beam expanding structure.

BACKGROUND

High-speed semiconductor lasers are core devices of high-speed communication systems. A high-performance transmitter is a device which uses a high-power and low-noise DFB laser as its light source and loads data by using a direct modulation or an external modulation. The external modulation technology may achieve a wide range of modulation frequency (>75 GHz), but there are some shortcomings, such as large size, high cost, high drive voltage and a large insertion loss (6~7 dB). A directly modulated semiconductor laser is to superimpose a modulation signal on a DC bias current, and it may modulate amplitude of a laser output signal, and achieves an efficient light emission. Besides, it has many unique advantages, such as a small volume, a low power consumption, a high linearity, and easy to use.

The directly modulated laser may cause a decreased relaxation oscillation frequency due to its internal physical effects and an effect of parasitic parameter, which limits an operating rate of a transmission system. In general, a light output end surface of the semiconductor laser is easily to be optically damaged, so a power density near the end surface of the laser determines an output light power and responding dynamic range of the semiconductor laser.

The output light power and the relaxation oscillation frequency of the semiconductor laser are proportional to an injection current. With an increased injection current, a peak of the relaxation oscillation frequency moves toward the high frequency direction. However, increasing injection current tends to cause an irreversible damage to the end surface of the semiconductor laser, or even burn up the semiconductor laser.

SUMMARY

The present disclosure is aimed to increase an injection current of a laser without causing its end surfaces being optically damaged so as to improve a modulation bandwidth of the laser while increasing its output light power.

In order to solve the above technical problems, the present disclosure proposes a semiconductor laser having an optical waveguide structure, the optical waveguide structure comprising a lower waveguide layer, an active layer of multiple quantum wells and an upper waveguide layer, which are successively stacked from bottom to top, a grating layer being formed on upper portion of the active layer, wherein the upper waveguide layer is formed as a ridge which has a light incidence end surface and a light output end surface, wherein a beam expanding structure is formed on one end of the output end surface.

According to an aspect of the disclosure, the beam expanding structure may have a beam expanding portion with a shape gradually contracted inwards from the light output end surface.

According to another aspect of the disclosure, the beam expanding portion may have a horizontal divergence angle of 5° to 20°.

According to an aspect of the disclosure, the beam expanding portion may have a length of 5 µm to 30 µm.

According to another aspect of the disclosure, the light incident end surface may be coated with a high-reflection film, and the light output end surface may be coated with an antireflection film.

According to another aspect of the disclosure, the lower waveguide layer may be a thickness difference with the upper waveguide layer.

According to another aspect of the disclosure, the thickness difference ranges from 30 nm to 60 nm.

According to another aspect of the disclosure, a buffer layer is provided below the lower waveguide layer.

According to another aspect of the disclosure, the upper portion of the optical waveguide structure, except for the light incidence end surface and light output end surface, may be covered with a cladding layer.

According to another aspect of the disclosure, the beam expanding structure is also formed on one end of the light incidence end surface.

According to another aspect of the disclosure, the beam expanding structure is a beam expanding structure formed by change of width, thickness and/or refractive index of the ridge.

By constructing the beam expanding structure at the light output end surface, the semiconductor laser according to the present disclosure may suppress the light expansion in a horizontal direction and improve the beam quality to achieve a better mode matching with an optical fiber. The beam expanding structure of the present disclosure may reduce the light power density at a surface of the laser cavity, thereby increasing the output power of the semiconductor laser and improving the characteristics of the high-frequency response of the semiconductor laser.

BRIEF DESCRIPTION OF THE DRAWINGS

The present disclosure will now be described in further detail with reference to the embodiments and the accompanying drawings, in which.

DETAILED DESCRIPTION

In order to achieve the above object, the present disclosure provides a semiconductor laser with a light output end surface having a beam expanding structure. In particular, the semiconductor laser may comprise an optical waveguide structure comprising a lower waveguide layer, an active layer of multiple quantum wells and an upper waveguide layer, which are successively stacked from bottom to top, and a grating layer is formed on the upper portion of the active layer. The upper waveguide layer is formed as a ridge, wherein the beam expanding structure is formed on its light output end surface. With respect to a laser having a resonant cavity of L, the so called beam expanding structure refers to a structure in which projections of its light incidence end surface and light output end surface on a Brag grating may have two mutually parallel sides with different lengths and the length direction of the resonant cavity is perpendicular to said two mutually parallel sides. A part of the beam expanding structure which begins from the light incidence end surface of the cavity to a portion which has a length of $L_1$ appears in a rectangle shape, and the other part which begins from the portion at $L_1$ to a portion which has a length of $L_2$ is in a trumpet shape, wherein the light expansion length of $L_2$ is preferably from 5 μm to 30 μm, and a horizontal divergence angle is preferably from 5° to 20°.

The present disclosure will now be further described with specific embodiments.

Figure 1:
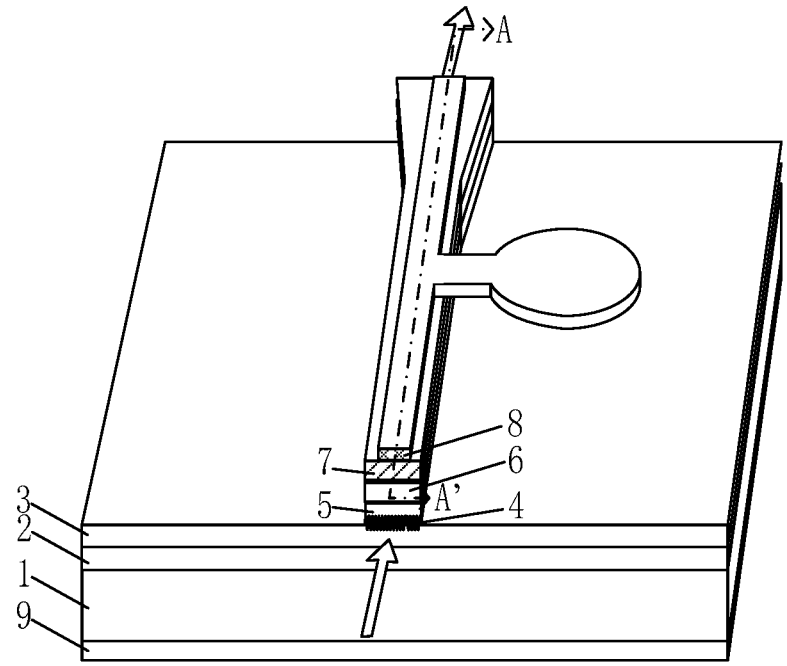
FIG. 1 is a schematic diagram illustrating a high speed semiconductor laser according to an embodiment of the disclosure, which may have a light beam expanding structure at its light output end surface.
Figure 2:
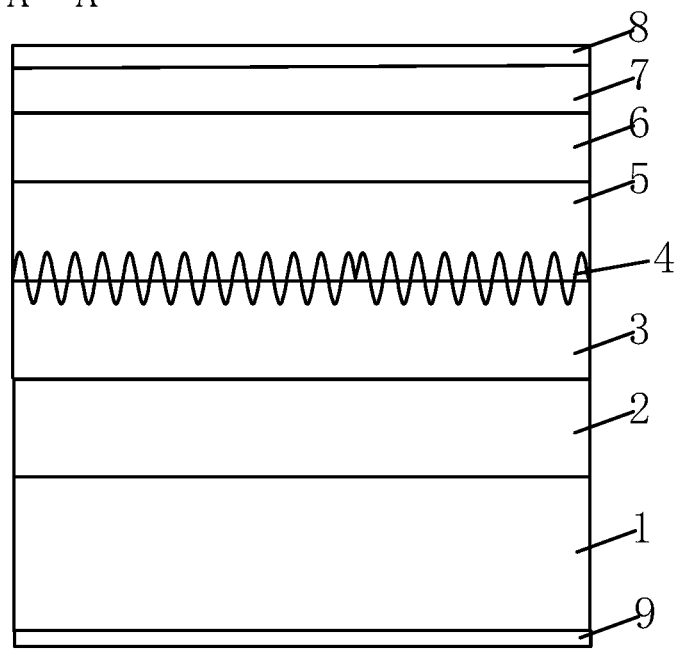
FIG. 2 is a cross-sectional view taken along line A-A' in FIG. 1.

FIG. 1 is a schematic diagram illustrating a high speed semiconductor laser according to an embodiment of the disclosure, which may have a light beam expanding structure at its light output end surface. FIG. 2 is a cross-sectional view taken along line A-A' in FIG. 1. As shown in FIGS. 1 and 2, the laser may comprises a N electrode layer 9, a buffer layer 1, a lower waveguide layer 2, an active layer of multiple quantum wells 3, a grating layer 4, an upper waveguide layer 5, a cladding layer 6, a contact layer 7 and a P electrode layer 8, which are successively stacked from bottom to top. In particular, the lower waveguide layer 2, the active layer 3 of multiple quantum wells and the upper waveguide layer 5 may constitute the optical waveguide structure, and the grating layer 4 is formed in an upper portion of the active layer 3.

Figure 3:
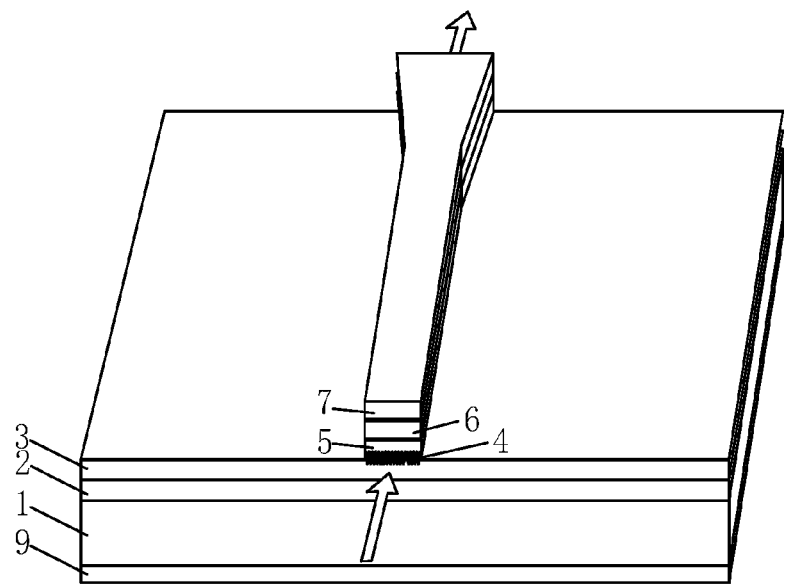
FIG. 3 is a schematic diagram illustrating a 3D structure of the high speed semiconductor laser having a light beam expanding structure at its light output end surface after removing its P electrode layer (8) according to the embodiment of the disclosure.

FIG. 3 is a schematic diagram illustrating a 3D structure of the high speed semiconductor laser according to the embodiment as mentioned above after removing its P electrode layer (8). As shown in FIG. 3, the upper waveguide layer 5 is formed as a ridge, without covering the whole active layer 3. After the upper waveguide layer 5 is formed, the cladding layer 6 is used to cover on top of the upper waveguide layer 5. The ridge of the upper waveguide layer 5 has a light incidence end surface and a light output end surface. Arrows in FIG. 3 show the incident and output directions of the light.

Figure 4:
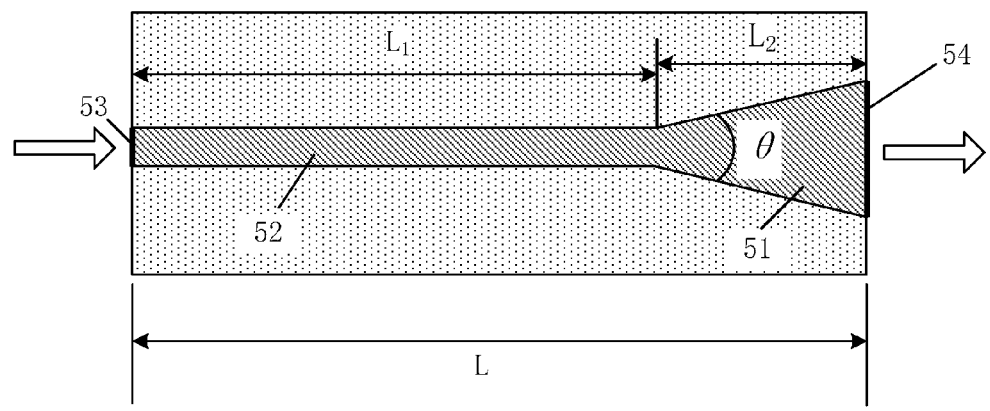
FIG. 4 shows a plan view of the beam expanding structure.

As shown in FIG. 3, the ridge has the light incidence end surface and the light output end surface, and a beam expanding structure is provided at the light output end surface. The beam expanding structure has a beam expanding portion. the beam expanding structure may be also on one end of the light incidence end surface. FIG. 4 shows a plan view of the beam expanding structure. As shown in FIG. 4, the beam expanding structure includes a beam expanding portion 51 and a flat portion 52, wherein the light incidence end surface 53 is on the left side and the light output end surface 54 which has a light expanding portion is on the right side. As shown in FIG. 4, the beam expanding portion is in a shape which gradually contracts inwards from the light output end surface or is referred to as a trumpet shape. It should be further pointed out that the beam expanding structure may be formed by change of shape along a horizontal direction in the paper plane. The beam expanding structure according to the present disclosure may be a beam expanding structure formed by change of width, thickness and/or refractive index of the ridge.

Preferably, the beam expanding portion has a horizontal divergence angle of 5° to 20°, which should be matched with the divergence angle of a diffraction-free beam, i.e., the horizontal divergence angle is equal to or smaller than the diffraction angle of a fundamental mode, so as to prevent higher order modes from being coupled into the fundamental mode and to obtain a high differential quantum efficiency by effectively utilizing carriers.

In this embodiment, the laser has a length of 200~800 μm, and the beam expanding portion preferably has a length $L_2$ of 5~30 μm. By using the above beam expanding structure, a lateral dimension of a light spot may be increased, a light emitting area of the laser device at the light output end surface may be extended, and a light power density at a unit of the light output end surface may be reduced in the same output power.

In addition, the present disclosure proposes an asymmetric optical waveguide structure in which there is a thickness difference between the upper waveguide layer 5 and the lower waveguide layer 2, thereby increasing difference between optical limiting factors of the fundamental mode and the higher order modes, which may further prevent the higher order modes from lasing. For the waveguide layer with a certain thickness, the optical limiting factors of the fundamental mode and the higher order modes decrease with an increased thickness difference of the upper waveguide layer 5 and the lower waveguide 2 at both sides of the active layer 3 of the multiple quantum well. However, the decreasing rate of the optical limiting factor of the high order modes is much faster than that of the fundamental mode, thus, the difference between the optical limiting factors of the fundamental mode and the higher order modes increases correspondingly. For the waveguide layer with a thickness of 2 μm, when the thickness difference between the upper waveguide layer 5 and the lower waveguide layer 2 at both sides of the active layer 3 of the multiple quantum well is 30~60 nm, the optical limiting factors of the fundamental mode is 1.55 times higher than that of the higher order modes. For an asymmetric light divergence structure, the thickness of the lower waveguide layer 2 is generally greater than that of the upper waveguide layer 5, due to the fact that the mobility of holes is smaller than that of electrons and the absorption loss of light by holes is much greater.

The use of the beam expanding structure may have following advantages: (1) the light-expansion in the horizontal direction may be suppressed, which may improve the beam quality; (2) the expanding structure changes a numerical aperture of the waveguide, and an obliquely reflected light may be coupled back to the active region, achieving a better mode matching with the optical fiber; (3) the end surface of the laser waveguide is a place where the field distribution is concentrated due to the unevenness, thus, the end surface of the laser waveguide is also a place which is easily to be optically damaged. Thus, by expanding the beam at the end surface and reducing the unevenness and the light power density at the uneven places, the damage threshold for the end surface may be improved, which may further increase the injection current, thereby increasing the output power; (4) since relaxation oscillation frequency moves toward a high frequency direction when the injection current of the semiconductor laser is increased, the increasing of the injection current may improve the high frequency response characteristic of the laser and increase dynamic range of the modulation bandwidth.

In an embodiment, a material of the buffer layer 1 may be selected from Group III-V compound semiconductor materials, Group II-VI compound semiconductor materials, Group IV-VI compound semiconductor materials or quaternary compound semiconductor materials. In this embodiment, a material of the buffer layer is InP with a thickness of 200 nm and a dopant concentration of about $1\times10^{18}$ cm$^{-2}$. The lower waveguide layer 2 is formed on the buffer layer 1. In this embodiment, the lower waveguide layer 2 is an undoped lattice-matched InGaAsP material with a thickness of 100 nm.

The active layer 3 of multiple quantum wells is formed on the lower cladding layer 2. In this embodiment, the active layer 3 of multiple quantum wells employs strained InGaAsP multi-quantum wells, for example, having seven quantum wells, with a well width of 8 nm, 1% compressive strain, and a barrier width of 10 nm. The active layer 3 is made of lattice matching materials having a fluorescence wavelength of 1200 nm. Compared with ordinary double hetero junction lasers, the quantum well lasers have characteristics such as a low threshold, a high output power and a high modulation rate by utilizing the quantum wells to increase the differential gain, introducing the compressive strain and the extensive strain into the quantum wells to increase the differential gain, and optimizing the thickness of the well and the barrier to reduce a transport time of the carriers passing through the light confinement layer and escape of carries from the active region.

The grating layer 4 is formed in the upper portion of the active layer 3 of multiple quantum wells. In this embodiment, the grating layer 4 has a thickness of 70 nm. The grating structure of the grating layer 4 may be fabricated by a holographic interferometry exposure, a double beam interferometry, or a nano-imprint lithography. In this embodiment, one end of the grating layer 4 is coated with a high-reflection film and the other end is coated with an antireflection film, so that energy of the lights other than the selected mode are reflected and converted into energy of the lasing mode. Since wavelengths of stray waves are not concentrated, they do not change the wavelength of the lasing mode.

The upper waveguide layer 5 is formed on the grating layer 4. In this embodiment, the upper waveguide layer 5 is a secondary epitaxial P-type lattice matching InGaAsP waveguide layer with a fluorescence wavelength of 1200 nm and a doping concentration of $1\times10^{17}$ cm$^{-2}$. The upper waveguide layer 5 has a grating layer, in which the thickness of the upper waveguide layer 5 on this grating layer is 100 nm. A P-type InP confining layer has a thickness of 1700 nm and a doping concentration gradually changes from $3\times10^{17}$ cm$^{-2}$ to $1\times10^{18}$ cm$^{-}$. The primary function of the upper waveguide layer is to reduce the scattering loss at the interface and to improve the coupling efficiency. In this embodiment, the upper waveguide layer 5 is a ridge waveguide which may be formed by etching. The ridge waveguide is mainly used for obtaining a single mode output, so as to construct a high speed laser having an output approaching the diffraction limit. Normally, the ridge waveguide has a length in the order of several hundred μm and a width of 3 μm, wherein the trench at the side of the ridge has a width 20 μm and a depth of 1.5 μm. Materials such as SiO$_2$ or organic BCB may be filled around the ridge to form an insulating layer by using plasma enhanced chemical vapor deposition.

After the gratings are fabricated on the grating layer 4, the cladding layer 6 is grown on the upper waveguide layer 5 by using the secondary epitaxial growth. The cladding layer 6 is P-InP and P-type InGaAsP with a thickness of 100 nm and a doping concentration of $1\times10^{19}$ cm$^{-2}$. The contact layer of InGaAs has a thickness of 100 nm. The ridge waveguide generally has a thickness in the order of hundreds of microns and a width of 3 microns, and the trench at the side of the ridge has a width of 20 μm and a depth of 1.5 μm. Materials such as SiO$_2$ or organic BCB may be filled around the ridge to form an insulating layer by using plasma enhanced chemical vapor deposition.

The contact layer 7 is formed on the cladding layer 6, which may be formed by etching simultaneously with the ridge waveguide. The contact layer is made of an InGaAs material with a thickness of 100 nm.

Furthermore, in this embodiment, a P-electrode 8 is formed on the contact layer 7, and an N-electrode 9 is formed on the back surface of the buffer layer 1. An insulating layer made of SiO$_2$ is filled at both sides of the ridge. The P-electrode 8 is formed as a stripe-like electrode on the ridge structure. A circular metal electrode is formed on the insulating layer.

In the following, the principle of improving the high frequency response of the laser by using the beam expanding structure is further explained.

The relationship between the modulation bandwidth B of the semiconductor laser and respective parameters of the laser is as follows:

$$B=(1/2\pi)\sqrt{AP_0/\tau_p}$$

wherein A is a differential gain of the light which is a constant, $P_0$ is a photon density at a steady state in the active region and $\tau_p$ is lifetime of the photons.

The modulation bandwidth of the laser may be increased by: (1) reducing the lifetime of photons; (2) increasing the differential gain A; (3) increasing bias optical power $P_0$. The photon density within the laser is proportional to the output light power density. For a GaAs-based laser which is commonly used in data communication links, increasing the light power density may lead to an inappropriate degradation, or even a catastrophic failure.

Optical catastrophic damage at the end surface of a cavity is one of the main factors to limit the output power of the laser. The occurrence of catastrophic damage is mainly due to the presence of a surface state or an interface state in the cavity of the semiconductor laser, which are nonradiative recombination centers. In particular, the electron-hole pairs produced by light absorption near the end surface may pass through these nonradiative recombination centers and cause the nonradiative recombination. When the output power of the semiconductor laser is increased, the light power density at the light output end surface of the device is also continuously increased. Besides, the light absorption caused by the defects of the end surface is also increased, which may further increase the temperature at the end surface and cause the band gap around the end surface to be contracted, thereby further increasing the light absorption and the temperature. When the temperature at the end surface reaches melting point of the material of the light emitting region, the end surface of the device will be melt and catastrophic damage occurs.

Therefore, the semiconductor laser according to the present disclosure may suppress the expansion of the light in the horizontal direction and improve the beam quality by using the beam expanding structure, which may achieve a better mode matching with the optical fiber. The beam expanding structure reduces the light power density at the light output end surface of the cavity, thereby increasing the output power of the laser and improving the high frequency response characteristics of the laser.

The foregoing, the detailed description of the objects, technical solutions and advantages of the present disclosure will be understood by way of example only, and it is to be understood that the foregoing description is only for the specific embodiments of the invention and is not intended to be limiting of the invention. Any modifications, equivalent substitutions, improvements, and the like within the spirit and principles of the invention are intended to be included within the scope of the present disclosure.

What is claimed is:

1. A semiconductor laser having an optical waveguide structure, the optical waveguide structure comprising a lower waveguide layer, an active layer of multiple quantum wells and an upper waveguide layer, which are successively stacked from bottom to top, a grating layer being formed on upper portion of the active layer, wherein the upper waveguide layer, a cladding layer and a contact layer are formed as a ridge which has a light incidence end surface and a light output end surface, wherein a beam expanding structure is formed on one end of the output end surface.

2. The semiconductor laser according to claim 1, wherein the beam expanding structure has a beam expanding portion with a shape gradually contracted inwards from the light output end surface.

3. The semiconductor laser according to claim 2, wherein the beam expanding portion has a horizontal divergence angle of 5° to 20°.

4. The semiconductor laser according to claim 2, wherein the beam expanding portion has a length of 5 μm to 30 μm.

5. The semiconductor laser according to claim 1, wherein the light incident end surface is coated with a high-reflection film, and the light output end surface is coated with an antireflection film.

6. The semiconductor laser according to claim 1, wherein the lower waveguide layer has a thickness difference with the upper waveguide layer.

7. The semiconductor laser according to claim 6, wherein the thickness difference ranges from 30 nm to 60 nm.

8. The semiconductor laser according to claim 1, wherein a buffer layer is provided below the lower waveguide layer.

9. The semiconductor laser according to claim 2, wherein a buffer layer is provided below the lower waveguide layer.

10. The semiconductor laser according to claim 3, wherein a buffer layer is provided below the lower waveguide layer.

11. The semiconductor laser according to claim 4, wherein a buffer layer is provided below the lower waveguide layer.

12. The semiconductor laser according to claim 5, wherein a buffer layer is provided below the lower waveguide layer.

13. The semiconductor laser according to claim 6, wherein a buffer layer is provided below the lower waveguide layer.

14. The semiconductor laser according to claim 7, wherein a buffer layer is provided below the lower waveguide layer.

15. The semiconductor laser according to claim 1, wherein the beam expanding structure is a beam expanding structure formed by change of width, thickness and refractive index of the ridge.

16. The semiconductor laser according to claim 1, wherein the beam expanding structure is a beam expanding structure formed by change of at least a width of the ridge.

17. The semiconductor laser according to claim 1, wherein the beam expanding structure is a beam expanding structure formed by change of at least a thickness of the ridge.

18. The semiconductor laser according to claim 1, wherein the beam expanding structure is a beam expanding structure formed by change of at least a refractive index of the ridge.

* * * * *